(12) United States Patent
Suh et al.

(10) Patent No.: US 9,619,060 B2
(45) Date of Patent: Apr. 11, 2017

(54) DISPLAY DEVICE AND METHOD OF OPERATING AND MANUFACTURING THE DISPLAY DEVICE

(71) Applicant: Samsung Electronics Co., Ltd., Suwon-si (KR)

(72) Inventors: Sung Joo Suh, Seoul (KR); Chang Kyu Choi, Seongnam-si (KR); Du Sik Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 102 days.

(21) Appl. No.: 13/935,688

(22) Filed: Jul. 5, 2013

(65) Prior Publication Data

US 2014/0132530 A1 May 15, 2014

(30) Foreign Application Priority Data

Nov. 13, 2012 (KR) .......... 10-2012-0128244

(51) Int. Cl.
| | |
|---|---|
| *G06F 3/041* | (2006.01) |
| *G06F 3/042* | (2006.01) |
| *H04N 1/00* | (2006.01) |
| *H04N 1/195* | (2006.01) |
| *H01L 27/32* | (2006.01) |
| *H04N 1/107* | (2006.01) |

(52) U.S. Cl.
CPC .......... *G06F 3/0412* (2013.01); *G06F 3/0421* (2013.01); *H04N 1/00347* (2013.01); *H04N 1/19584* (2013.01); *H01L 27/3223* (2013.01); *H04N 1/107* (2013.01); *H04N 2201/0081* (2013.01); *H04N 2201/0089* (2013.01)

(58) Field of Classification Search
CPC ..... G06F 3/002; G06F 3/0412; H01L 27/3223
USPC .......... 345/146, 660, 82, 173, 419; 358/1.15
See application file for complete search history.

(56) References Cited

U.S. PATENT DOCUMENTS

| | | | |
|---|---|---|---|
| 2004/0080267 A1 | 4/2004 | Cok | |
| 2004/0140973 A1* | 7/2004 | Zanaty | H04N 5/335 345/214 |
| 2006/0007222 A1* | 1/2006 | Uy | H01L 27/14603 345/207 |
| 2006/0157640 A1* | 7/2006 | Perlman | H04N 5/2254 250/208.1 |
| 2007/0040888 A1* | 2/2007 | Seo | B41J 2/451 347/238 |
| 2007/0242055 A1 | 10/2007 | Lai | |
| 2008/0106628 A1* | 5/2008 | Cok | H04N 7/144 348/333.01 |
| 2008/0116787 A1 | 5/2008 | Hsu et al. | |
| 2008/0122792 A1* | 5/2008 | Izadi et al. | 345/173 |

(Continued)

FOREIGN PATENT DOCUMENTS

| | | |
|---|---|---|
| KR | 10-2003-0067566 | 8/2003 |
| KR | 10-2010-0058314 | 6/2010 |

(Continued)

*Primary Examiner* — Tony Davis
(74) *Attorney, Agent, or Firm* — NSIP Law

(57) ABSTRACT

A display device, and a method of operating and manufacturing the display device may receive input light from an object to be scanned that is positioned in front of a display for displaying an image, and may perform scanning of the object to be scanned.

24 Claims, 13 Drawing Sheets

FIG. 2B

(56) References Cited

U.S. PATENT DOCUMENTS

| | | | |
|---|---|---|---|
| 2009/0121985 A1 | 5/2009 | Kang et al. | |
| 2009/0212112 A1* | 8/2009 | Li | G06K 7/10 |
| | | | 235/462.12 |
| 2010/0289752 A1* | 11/2010 | Birkler | 345/173 |
| 2011/0117958 A1* | 5/2011 | Kim et al. | 455/556.1 |
| 2011/0175902 A1* | 7/2011 | Mahowald | H04N 13/0495 |
| | | | 345/419 |
| 2011/0199636 A1* | 8/2011 | Katsuda | G03B 21/26 |
| | | | 358/1.15 |
| 2011/0285891 A1* | 11/2011 | Maglaque | H04N 7/144 |
| | | | 348/308 |
| 2011/0304532 A1* | 12/2011 | Suh et al. | 345/156 |
| 2012/0006978 A1 | 1/2012 | Ludwig | |
| 2012/0026160 A1* | 2/2012 | Suh et al. | 345/419 |
| 2012/0176298 A1* | 7/2012 | Suh | H01L 27/3234 |
| | | | 345/82 |
| 2012/0182437 A1* | 7/2012 | Dudek | H04N 7/144 |
| | | | 348/220.1 |
| 2013/0033640 A1* | 2/2013 | Lee | H04N 1/107 |
| | | | 348/376 |
| 2013/0141354 A1* | 6/2013 | Tsai | G06F 3/042 |
| | | | 345/173 |
| 2015/0036794 A1* | 2/2015 | Hsieh | G06T 11/008 |
| | | | 378/19 |

FOREIGN PATENT DOCUMENTS

| | | |
|---|---|---|
| KR | 10-2010-0073045 | 7/2010 |
| KR | 10-2010-0102288 | 9/2010 |

* cited by examiner

<FIRST OLED PIXEL>

<SECOND OLED PIXEL>

DISPLAY DEVICE AND METHOD OF OPERATING AND MANUFACTURING THE DISPLAY DEVICE

CROSS-REFERENCE TO RELATED APPLICATIONS

This application claims the priority benefit of Korean Patent Application No. 10-2012-0128244, filed on Nov. 13, 2012, in the Korean Intellectual Property Office, the disclosure of which is incorporated herein by reference.

BACKGROUND

1. Field

The following description relates to a display device and a method of operating and manufacturing the display device.

2. Description of the Related Art

A general liquid crystal display (LCD) touch device has a touch sensing function as a main function but does not have a scanning function for a document and the like. To implement the scanning function, the LCD touch device may acquire a scan image through a separate external device such as a camera, for example.

Accordingly, there is a need for a display device that enables scanning of an object positioned in front of a display.

SUMMARY

The foregoing and/or other aspects are achieved by providing a display device, including: a pattern panel including a plurality of display pixels; a sensor panel to sense N images from input light that is received in association with an object to be scanned and is received through a portion of the plurality of display pixels, N being a natural number; and an image creator to create a full image of the object to be scanned based on the N images.

A portion of the plurality of display pixels may allow the input light to pass and another portion of the plurality of display pixels may not allow the input light to pass.

The plurality of display pixels may be arranged based on a predetermined arrangement rule, depending on whether the plurality of display pixels allows the input light to pass.

Among the plurality of display pixels, a display pixel that does not allow the input light to pass may be disposed around a display pixel that allows the input light to pass.

The plurality of display pixels may be arranged in a modified uniformly redundant array (MURA) pattern.

The image creator may create a depth image of the object to be scanned based on the N images.

At least a portion of the plurality of display pixels may include a transparent window.

A display pixel excluding a display pixel including the transparent window from among the plurality of display pixels may include an opaque window.

The sensor panel may sense the N images from the input light that is received through a display pixel including the transparent window among the plurality of display pixels.

The image creator may create the full image of the object to be scanned by partially overlapping adjacent images among the N images.

The plurality of display pixels may include an organic light emitting diode pixel.

The display device may further include a display controller to control at least a portion of the plurality of display pixels to emit light toward the object to be scanned.

At least a portion of the plurality of display pixels may include an infrared (IR) unit to emit IR light toward the object to be scanned.

The display device may further include a light emitter to emit light toward the object to be scanned.

The display device may further include a front display including the pattern panel to display the created full image.

The display device may further include a rear display positioned on the opposite side of the pattern panel to display at least a portion of the created full image.

The foregoing and/or other aspects are achieved by providing a display device, including: a pattern panel including a plurality of display pixels; a substrate disposed below the pattern panel; and a sensor panel disposed below the substrate to sense N images from input light that is received through a portion of the plurality of display pixels, N being a natural number.

The pattern panel may include a plurality of organic light emitting diode pixels and a thin film transistor (TFT) array.

Each of the plurality of organic light emitting diode pixels may include one of a transparent window and an opaque window.

Each of the plurality of organic light emitting diode pixels may include an IR unit to emit IR light.

The foregoing and/or other aspects are achieved by providing a method of operating a display device, the method including: sensing N images from input light that is received in association with an object to be scanned and is received through a portion of the plurality of display pixels, N being a natural number; and creating a full image of the object to be scanned based on the N images. A portion of the plurality of display pixels may allow the input light to pass and another portion of the plurality of display pixels may not allow the input light to pass.

The creating may include creating the full image of the object to be scanned by partially overlapping adjacent images among the N images.

The display device operating method may further include controlling at least a portion of the plurality of display pixels to emit light toward the object to be scanned.

The display device operating method may further include displaying at least a portion of the created full image on a rear display that is positioned on an opposite side of the plurality of display pixels.

The foregoing and/or other aspects are achieved by providing a method of manufacturing a display device, the method including: forming a pattern panel including a plurality of display pixels; forming a substrate disposed below the pattern panel; and forming a sensor panel disposed below the substrate to sense N images from input light that is received through a portion of the plurality of display pixels, N being a natural number.

The pattern panel may include a plurality of organic light emitting diode pixels and a TFT array.

Each of the plurality of organic light emitting diode pixels may include one of a transparent window and an opaque window.

Additional aspects of embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1A:
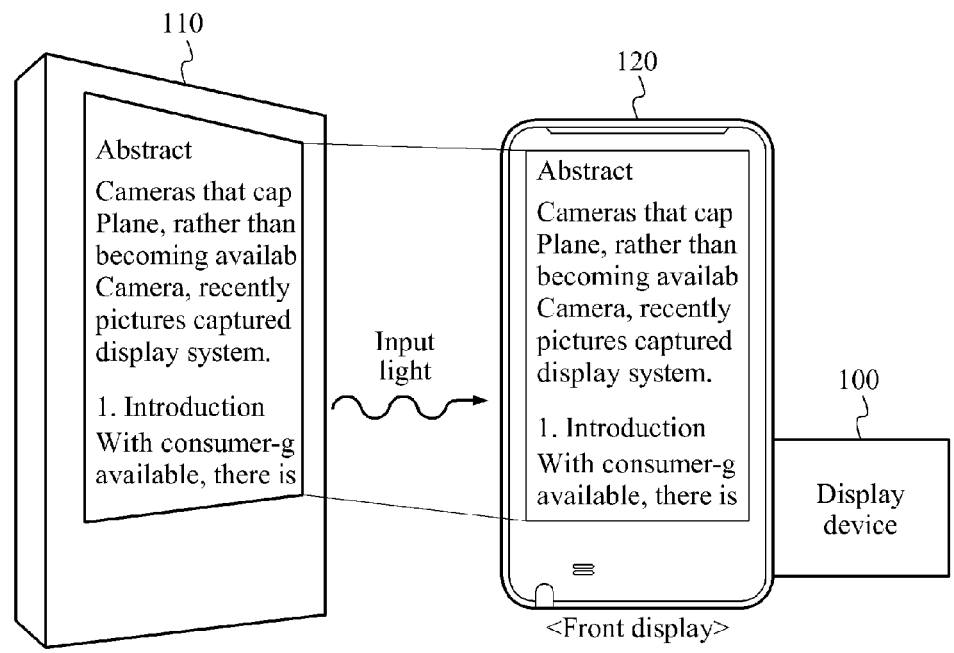
FIGS. 1A and 1B illustrate diagrams to briefly describe a configuration of a display device including a scanning function according to an embodiment.

Reference will now be made in detail to one or more embodiments, examples of which are illustrated in the accompanying drawings, wherein like reference numerals refer to like elements throughout. Embodiments are described below to explain the present disclosure by referring to the figures.

Depending on embodiments, a display pixel may include a light emitter to emit red, green, and blue (RGB) visible light. The display pixel may display an image by combining the RGB visible light. The display pixel may be an organic light emitting diode (OLED) pixel. In the case of using the OLED pixel as the display pixel, a brighter screen may be generated using a relatively small amount of power.

Unlike a general liquid crystal display (LCD) to generate light by a backlight, the OLED pixel may be a self-luminous device that generates light autonomously using an electroluminescence phenomenon where light is generated when current flows in a fluorescent organic compound. A display device using such an OLED pixel may have excellent color and definition, a viewing angle of light, a quick response speed, low power, thinness, and the like, compared to a general LCD and thus, is in the spotlight as a next generation display device followed by an LCD device, a plasma display panel (PDP), and the like.

A display device according to an embodiment may include, in an OLED pixel, a window that selectively allows input light from an object to be scanned to pass, and may achieve scanning of an image through the window or sensing of the input light, for example, a spatial touch of a user, and displaying of the image.

Figure 1B:
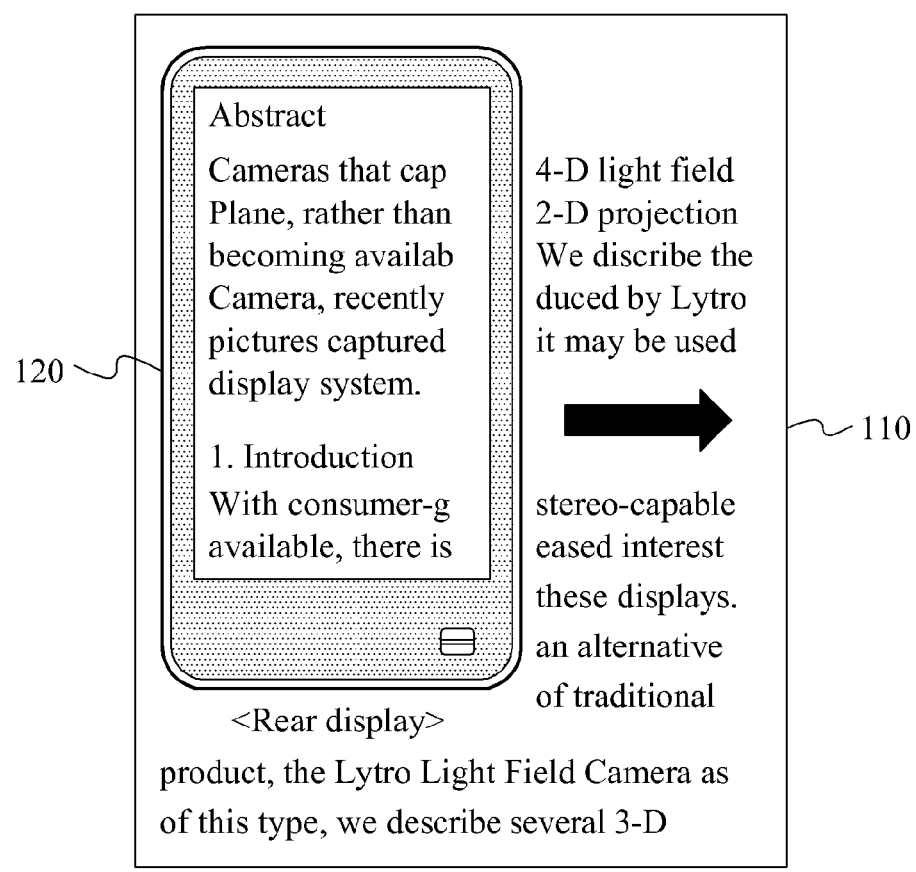

FIGS. 1A and 1B illustrate diagrams to briefly describe a configuration of a display device including a scanning function according to an embodiment.

FIG. 1A illustrates a scanning operation by a front display and FIG. 1B illustrates a scanning operation by a rear display.

Referring to FIGS. 1A and 1B, a display device 100 is configured to be included in a portable terminal 120. The above configuration is only an example and thus, the display device 100 may be configured to be separate from the portable terminal 120, or may be mounted to another device.

The display device 100 may be positioned in front of the portable terminal 120 to receive input light from an object to be scanned 110, and may create a full image of the object to be scanned 110 based on an image that is sensed by allowing the input light to pass through an imaging pattern.

The imaging pattern may be a pattern in which a plurality of display patterns is arranged. For example, in the case of using an OLED pixel as the display pixel, the imaging pattern may be formed by arranging, based on a predetermined arrangement rule, heterogeneous OLED pixels that are classified depending on a transparency of a window.

As one example, the imaging pattern may be provided as a pin-hole pattern in which an OLED pixel (hereinafter, a first OLED pixel) including a transparent window is surrounded by a plurality of OLED pixels (hereinafter, second OLED pixels) including an opaque window.

The display device 100 may include a plurality of imaging patterns that is provided as a pin-hole pattern. In this example, the display device 100 may create N images that observe the object to be scanned 110 from different viewpoints based on an incidence angle of input light that passes through the transparent window. Here, N denotes a natural number.

As another example, the imaging pattern may be provided as a modified uniformly redundant array (MURA) pattern. In this example, the imaging pattern may be formed by arranging the first OLED pixel and the second OLED pixel in a MURA pattern.

The display device 100 may include a plurality of imaging patterns that is provided as a MURA pattern. In this example, the display device 100 may create a depth image of a three-dimensional (3D) image as an image of the object to be scanned 110 based on input light that passes through each imaging pattern, and may estimate the 3D image of the object to be scanned 100 based on the depth images.

The display device 100 may create a full image of the object to be scanned 110 by sorting created images based on an arrangement position, for example, coordinates of each imaging pattern, and by combining adjacent images. For example, the display device 100 may combine two adjacent imaging patterns into a single image by overlapping a common portion between the two adjacent imaging patterns.

Next, the display device 100 may complete scanning of the object to be scanned 110 by displaying the created full image on a front display that is disposed to face the object to be scanned 110 or a rear display that is positioned at the rear of a terminal, which is opposite to the front display.

FIG. 1A illustrates an example in which the display device 100 creates a full image of the object to be scanned 110 that is positioned in front of the display device 100, reverses, or mirrors, the left and right of the full image based on a visual field of a user, and then displays the reversed full image on the front display of the portable terminal 120.

FIG. 1B shows an example in which the display device 100 creates a full image of the object to be scanned 110 by scanning the object to be scanned 110 while sliding the portable terminal 120 above the object to be scanned 110 and displays the created full image on the rear display of the portable terminal 120. Here, the display device 100 may display, on the rear display in real time, an area of the object to be scanned 110 that is captured according to sliding of the portable terminal 120. For example, in response to a scan command of the user, the display device 100 may record, as an image, a predetermined area that is being displayed on the rear display.

To display the full image on the rear display as illustrated in FIG. 1B refers to providing the user positioned behind a terminal with the full image captured through scanning, even though the object to be scanned 110 may be occluded by covering at least a portion of the object to be scanned with the front display and in this state, scanning is performed. The above example may be performed using an auxiliary display provided on the rear of the portable terminal 120.

The object to be scanned 110 may be an external object that is positioned in front of the portable terminal 120 and whose image is scanned by the display device 100, and is displayed on the front display or the rear display of the portable terminal 120. For example, the object to be scanned 110 may be an object within a viewing range of the portable terminal 120, or may be a document, or a name card, for example, that is closely attached to the portable terminal 120 and may include a text, a symbol, or an image, for example.

Figure 2A:
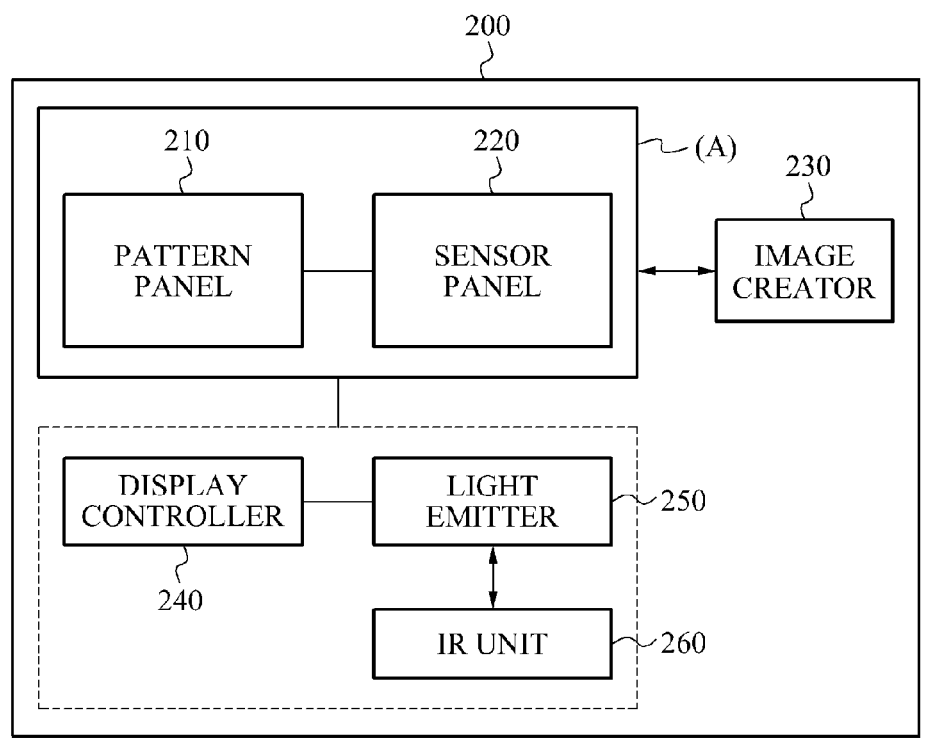
FIGS. 2A and 2B illustrate diagrams to describe in detail a configuration of a display device including a scanning function according to an embodiment.
Figure 2B:
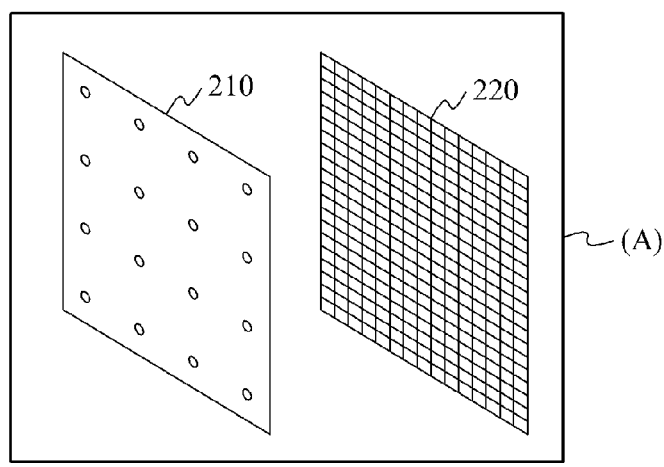

FIGS. 2A and 2B illustrate diagrams to describe in detail a configuration of a display device 200 including a scanning function according to an embodiment.

FIG. 2A illustrates an example of the display device 200 that includes a pattern panel 210, a sensor panel 220, and an image creator 230. FIG. 2B illustrates a part (A) that includes the pattern panel 210 and the sensor panel 220 of FIG. 2A.

Referring to FIGS. 2A and 2B, the pattern panel 210 may include a plurality of display pixels, such as a plurality of OLED pixels, for example.

A portion of the plurality of display pixels may allow input light to pass. For example, when a display pixel is an OLED pixel, a portion of a plurality of OLED pixels may be first OLED pixels that include a transparent window to allow the input light to pass.

Another portion of the plurality of display pixels may not allow the input light to pass. For example, when a display pixel is an OLED pixel, another portion of the plurality of OLED pixels may be second OLED pixels that include an opaque window that does not allow the input light to pass.

The pattern panel 210 may include a plurality of imaging patterns that is formed by arranging the plurality of display pixels. For example, when a display pixel is an OLED pixel, the pattern panel 210 may include the plurality of imaging patterns that is formed using the plurality of OLED pixels. By allowing input light from an object to be scanned to pass through the plurality of imaging patterns, the pattern panel 210 may provide an environment for scanning the object to be scanned.

When forming an imaging pattern, the pattern panel 210 may form various types of imaging patterns by combining, based on a predetermined arrangement rule, at least a portion of a plurality of display pixels including a transparent window and a display pixel including an opaque pixel, excluding a display pixel including a transparent window from the plurality of display pixels.

For example, when a display pixel is an OLED pixel, the pattern panel 210 may form various types of imaging patterns by combining a first OLED pixel including a transparent window and a second OLED pixel including an opaque window based on a predetermined arrangement rule. The first OLED pixel may be manufactured by adjusting an in-OLED pixel window to be transparent. The second OLED pixel may be manufactured by adjusting an in-OLED pixel window to be opaque.

According to an embodiment, the pattern panel 210 may form various types of imaging patterns by arranging the plurality of display pixels based on a predetermined arrangement rule, depending on whether the plurality of display panels allows the input light to pass.

For example, the pattern panel 210 may form an imaging pattern by arranging a display pixel that does not allow the input light to pass to be around a display pixel that allows the input light to pass.

As another example, the pattern panel 210 may form an imaging pattern by arranging the plurality of display pixels to be in a MURA pattern.

When a display pixel is an OLED pixel, the pattern panel 210 may form various types of imaging patterns by arranging the first OLED pixel and the second OLED pixel.

Referring to FIG. 2B, the pattern panel 210 may form an imaging pattern as a pin-hole pattern by disposing a plurality of second OLED pixels to be around a single first OLED pixel.

The pattern panel 210 may form various types of imaging patterns, for example, a MURA pattern by alternately disposing the first OLED pixel and the second OLED pixel to be in a predetermined pattern.

The pattern panel 210 may form an imaging pattern by arranging the first OLED pixel and the second OLED pixel based on a predetermined arrangement rule, depending on whether a window included in an OLED pixel is transparent.

The number of imaging patterns and positions thereof may be flexibly modified based on a size of a front display to receive the input light, the number of objects to be scanned, positions thereof, and the like. For example, when input light is received from each of the plurality of objects to be scanned, the pattern panel 210 may form an imaging pattern based on an incidence position of input light.

The pattern panel 210 may form a plurality of imaging patterns based on an external environment from which input light is received, and may flexibly change the number of imaging patterns or positions thereof at predetermined intervals. The pattern panel 210 may form a plurality of imaging patterns to be repeated horizontally or vertically based on a size of the front display.

An imaging pattern included in the pattern panel 210 will be described with reference to FIGS. 3A and 3B, and FIGS. 4A and 4B, based on an example in which a display pixel is an OLED pixel.

Figure 3A:
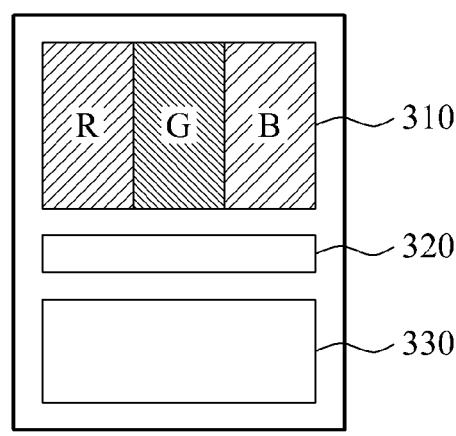
FIGS. 3A and 3B illustrate an example of a first organic light emitting diode (OLED) pixel and an example of a second OLED pixel, respectively.
Figure 3B:
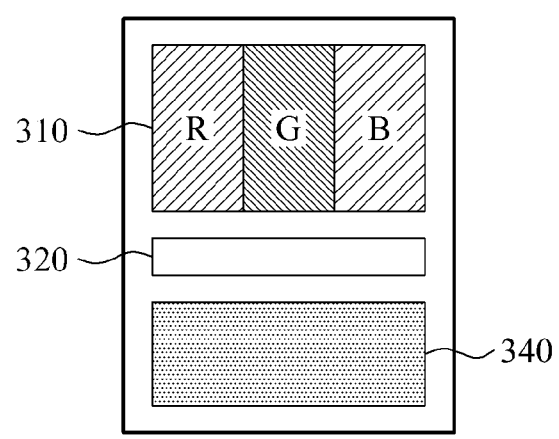

FIGS. 3A and 3B illustrate an example of a first OLED pixel and an example of a second OLED pixel, respectively.

FIG. 3A illustrates a structure of the first OLED in which an in-OLED pixel window is adjusted to be transparent. Referring to FIG. 3A. the first OLED pixel may include a light emitting area 310 to emit RGB light using a light emitting organic substance, a circuit area 320 to drive the light emitting area 310, and a transparent window 330 to transfer light to the rear of a panel to appear transparent.

The light emitting area 310 may display, on a front display or a rear display, an image that is created by one of red light, green light, and blue light, or a combination thereof.

The circuit area 320 may drive the light emitting area 310 associated with predetermined light among the red light, the green light, and the blue light by selectively applying power to the light emitting area 310. For the above operation, the circuit area 320 may be mounted with a tank chip, such as a central processing unit (CPU), a processor, and a memory, for example.

The transparent window 330 allows external input light to pass using glass or a transparent plastic in which an opaque layer is absent, and may acquire an image by the input light on the sensor panel 220 positioned at a rear end.

FIG. 3B illustrates a structure of the second OLED in which an in-OLED pixel window is adjusted to be opaque. The second OLED pixel may include the light emitting area 310 and the circuit area 320, which is the same as the first OLED pixel, and may include an opaque window 340 in which the transparent window 330 of FIG. 3A is adjusted to be opaque by adding an opaque layer.

In the opaque window 340, a degree of transparency is adjusted to be an opaque layer to prevent the external input light from passing. The opaque window 340 may form a dark portion in an imaging pattern by preventing the input light from being transferred to the sensor panel 220 at the rear end and the like.

Figure 4A:
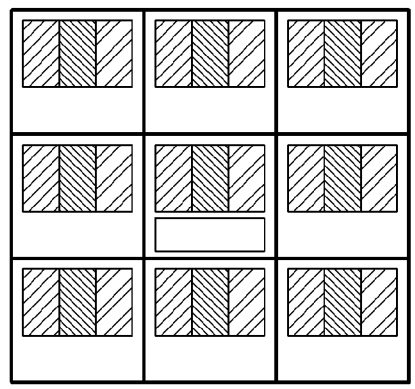
FIGS. 4A and 4B illustrate an example of an imaging pattern formed by arranging first OLED pixels and an example of an imaging pattern formed by arranging second OLED pixels, respectively.
Figure 4B:
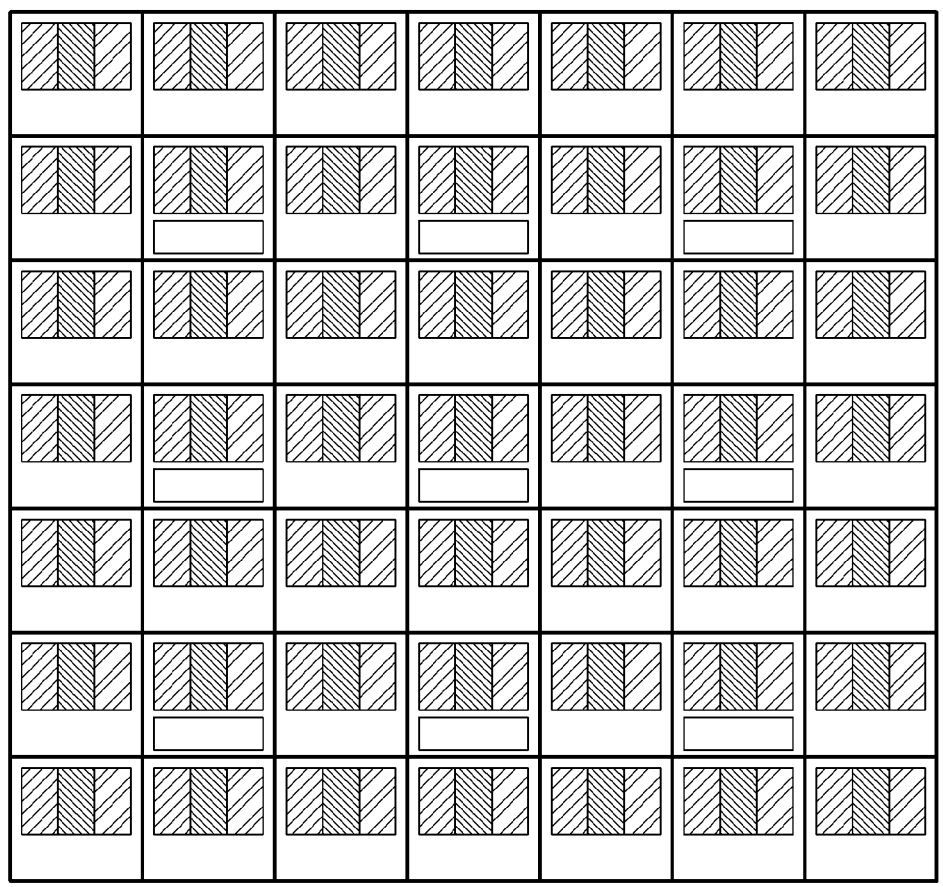

FIGS. 4A and 4B illustrate an example of an imaging pattern formed by arranging first OLED pixels and an example of an imaging pattern formed by arranging second OLED pixels, respectively.

The pattern panel 210 may not include a separate backlight unit by including a plurality of OLED pixels and may display an image by autonomously emitting light. Image displaying of the pattern panel 210 may be simultaneously performed together with passing of the input light through the imaging pattern and scanning of an object to be scanned.

FIG. 4A illustrates an example of an imaging pattern that is formed as a pin-hole pattern by disposing a plurality of, for example, eight second OLED pixels around a single first OLED pixel.

Referring to FIG. 4A, the first OLED pixel is disposed at the center in order to locate a transparent window of the first OLED pixel at a predetermined interval in a case in which a plurality of imaging patterns is formed to be the same pattern as illustrated in FIG. 4B. Depending on embodiments, a position of the first OLED pixel may be flexibly modified.

FIG. 4B illustrates an example of an imaging pattern group that is formed by stitching a plurality of unit imaging patterns of FIG. 4A. Here, compared to a case of arranging imaging patterns without sharing a portion of the first OLED pixels, a relatively greater number of pin-holes may be formed by sharing a portion of first OLED pixels between neighboring imaging patterns.

Depending on embodiments, a position of a pin hole formed in the imaging pattern group may be adjusted by changing an arrangement position of a first OLED pixel within a predetermined imaging pattern.

Referring again to FIG. 2, the sensor panel 220 may sense N images from an input light that is received in association with an object to be scanned and is received through a portion of the plurality of display pixels. Here, N denotes a natural number. In the case of performing scanning, the N images may be partial images of the object to be scanned. The sensor panel 220 may sense N images by allowing the input light to pass through each of the plurality of imaging patterns.

For example, the sensor panel 220 may perform scanning of the object to be scanned by sensing input light from the object to be scanned that passes through the imaging pattern included in the pattern panel 210 and by capturing an image of the object to be scanned. By maintaining the plurality of imaging patterns included in the pattern panel 210 to have a predetermined degree of transparency, it may be possible to stabilize the quality of the image captured by the sensor panel 220.

In the case of sensing an image, the sensor panel 220 may sense N images from input light that is received through a display pixel including a transparent window among the plurality of display pixels.

For example, when a display pixel is an OLED pixel, the sensor panel 220 may sense an image acquired by the input light that passes through the transparent window included in the first OLED pixel.

In FIG. 2B, the sensor panel 220 may sense the input light by configuring a sensor cell for sensing the input light and an opening through which the input light passes to be in a lattice pattern or an iterative pattern.

The sensor panel 220 may further include a color filter, and may sense an image corresponding to color of the color filter. For example, the sensor panel 220 may include a pixel configured as a red color filter, a pixel configured as a blue color filter, and a pixel configured as a green color filter. The sensor panel 220 may include a pixel that is configured to include a red color filter, a blue color filter, and a green color filter. The sensor panel 220 may acquire N color images with respect to N input lights using a red image, a blue image, and a green image that are acquired by the red color filter, the blue color filter, and the green color filter, respectively.

The image creator 230 may create a full image of the object to be scanned based on the N images. The image creator 230 may create the full image of the object to be scanned by combining the N images. For example, the image creator 230 may create, as the full image of the object to be scanned, a resulting image that is acquired by overlapping a plurality of images acquired by the sensor panel 220 based on a predetermined rule.

In the case of an image combination, the image creator 230 may create the full image of the object to be scanned by partially overlapping adjacent images among the N images. For example, the image creator 230 may create the full image by employing a combination scheme based on coordinates. The image creator 230 may assign coordinates to each of the imaging patterns, and may arrange and map images that are sensed by the sensor panel 220 based on the assigned coordinates. The image creator 230 may create the full image of the object to be scanned by overlapping a common portion between adjacent images.

Figure 5A:
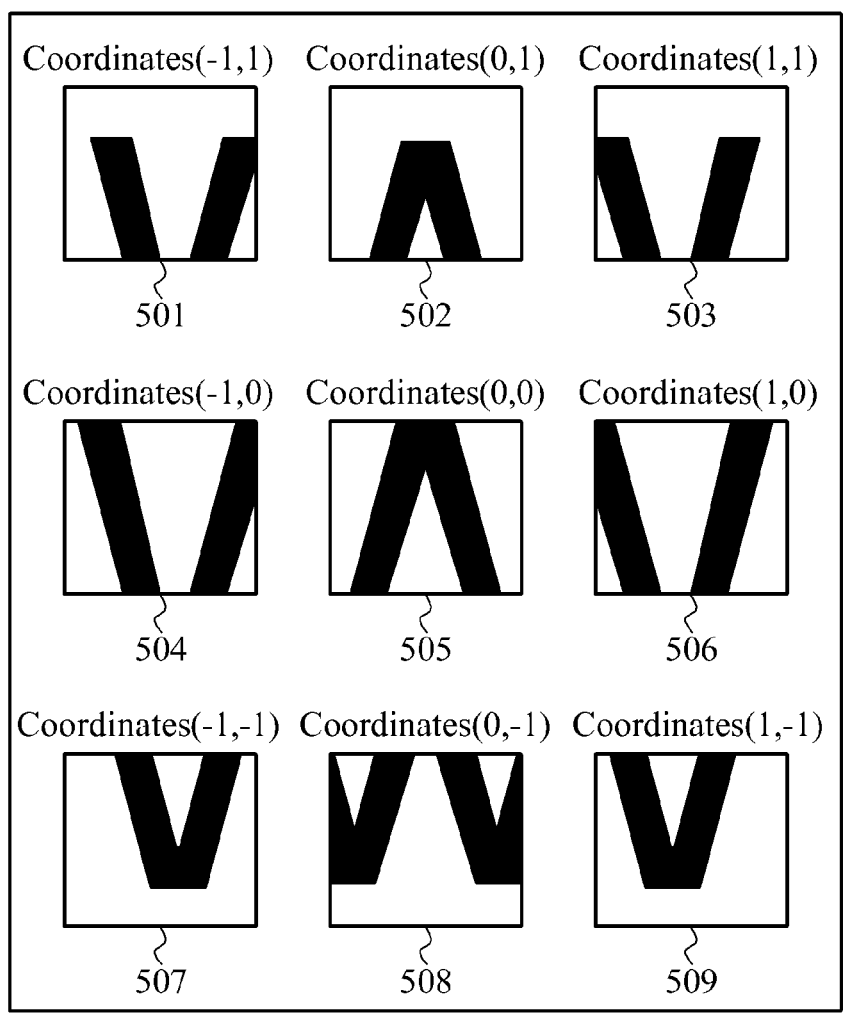
FIGS. 5A and 5B illustrate examples of creating a full image of an object to be scanned by combining images according to an embodiment.
Figure 5B:
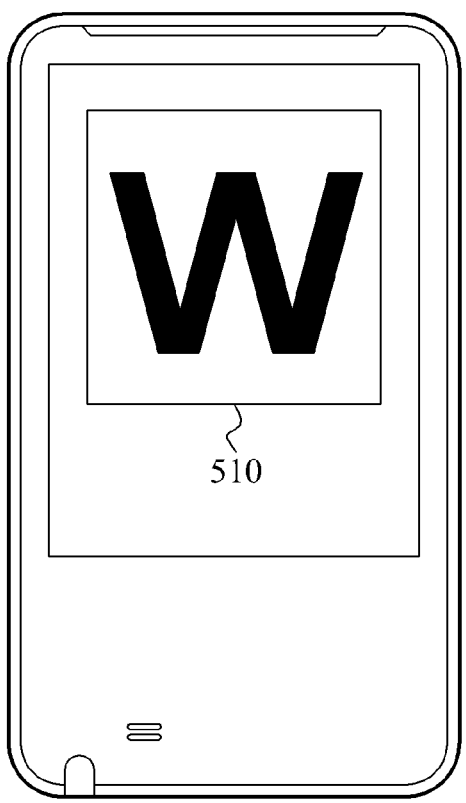

FIGS. 5A and 5B illustrate examples of creating a full image of an object to be scanned by combining images according to an embodiment.

FIG. 5A illustrates nine images 501 through 509 sensed in association with 3×3 imaging patterns, each assigned with coordinates. The image creator 230 may assign coordinates (−1, 1) to an upper leftmost imaging pattern and may sequentially assign coordinates (1, −1) to a lower rightmost imaging pattern based on a center imaging pattern that is assigned with coordinates (0, 0). The imaging creator 230 may match the images 501 through 509 sensed in association with the imaging patterns each assigned with coordinates, based on corresponding coordinates, and may combine adjacent images.

Here, the image creator 230 may combine images by overlapping a common portion between adjacent images. For example, the image creator 230 may combine the images 501 and 502 by overlapping a right diagonal line that is a common portion between the image 501 matching (−1, 1) and the image 502 matching (0, 1).

FIG. 5B illustrates a single full image that is created by combining the nine images 501 through 509 of FIG. 5A. Referring to FIG. 5B, the full image of "W" 510 is created by continuously overlapping common portions between the respective adjacent images.

The image creator 230 may create a depth image of a 3D image with respect to the object to be scanned, based on sensed N images. The depth image of the 3D image may refer to an image of the object to be scanned in which a spatial depth is represented using a plurality of images. For example, each image sensed in association with input light that passes through an imaging pattern provided as a MURA pattern may have a spatial depth difference based on an angle of incidence. The image creator 230 may create the full image of the object to be scanned by applying the above spatial depth.

The display device 200 may perform scanning with respect to the 3D image as well as a two-dimensional (2D) image by sensing input light from the object to be scanned that passes through the imaging pattern.

The display device 200 may include the pattern panel 210, and may further include a front display to display the created full image and a rear display positioned on an opposite side of the pattern panel 210 to display at least a portion of the created full image.

The front display may display the full image of the object to be scanned that is created through scanning, for a user positioned in front of a terminal.

The rear display may be mounted to a rear of the terminal in an auxiliary device form, and may display the full image for the user positioned at the rear of the terminal. For example, the rear display may perform scanning by covering the whole object to be scanned using the front display and thus, may display the full image according to scanning for the user positioned at the rear of the terminal even though the object to be scanned may be at least partially occluded by the front display. Depending on embodiments, the rear display may display in real time a front image of the terminal acquired through camera photographing, gesture sensing, and the like, as well as the full image according to scanning. Accordingly, the acquired image may be quickly visualized and be provided to the user that views the rear of the terminal.

The display device 200 may further include a display controller 240 that controls the front display or the rear display to display the full image of the object to be scanned.

In the above example, the display controller 240 may display the full image on at least a portion of the front display, or may display the full image on the rear display that is positioned at the rear of the terminal, which is opposite to the front display.

The display controller 240 may control at least a portion of the plurality of display pixels to emit light toward the object to be scanned. For example, the display controller 240 may control at least a portion of the plurality of display pixels to emit IR light toward the object to be scanned. The display controller 240 may control the plurality of display pixels to emit light, such as RGB light and visible light, for example, toward the object to be scanned.

For the above operation, the display device 200 may further include a light emitter 250 to emit visible light or an IR unit 260 to emit IR light.

The light emitter 250 may be a light emitting area included in an OLED pixel, and may emit visible light toward the object to be scanned. The IR unit 260 may be included in the OLED pixel to emit IR light toward the object to be scanned.

The emitted visible light or IR light may be reflected from the object to be scanned and be converted to the input light. When the object to be scanned does not emit input light autonomously due to blockage of natural light by the terminal performing scanning, the input light may be emitted as the visible light emitted by the light emitter 250 or the IR light emitted by the IR unit 260.

Accordingly, even in a dark state in which the light is blocked, the display device 200 may smoothly perform scanning of the object to be scanned by emitting artificial light toward the object to be scanned.

The display device 200 may be applied to a variety of fields such as proximity sensing, gesture recognition, and a photographing function, for example, by employing a scanning function to the object to be scanned.

In the case of displaying a 3D image, the display device 200 may photograph the object to be scanned and may acquire a distance from the terminal to the object to be scanned or a position of the object to be scanned, from a captured image. Accordingly, the display device 200 enables the gesture recognition and may easily sense a manipulation of a 3D image that appears to be positioned outside the terminal.

In the case of applying the display device 200 to a terminal supporting a video call, the user may make a video call while viewing a face of a counter party by matching an image display and a scanning position of the object to be scanned.

In the case of applying the display device 200 to a large screen such as Smart Window, distance information or position information about the counter party from the large screen may be acquired using an image acquired by capturing the counter party. Accordingly, the user may recognize a minute motion of the counter party, which enables the user to feel as if the user is present in the same space with the counter party.

The display device 200 may recognize that the object to be scanned has moved within a predetermined space, based on a change in a position at which input light is sensed. Accordingly, the display device 200 may verify, for example, a spatial movement of a drag that occurs after the user touches the space. The display device 200 may verify the spatial movement of the object to be scanned by assigning virtual coordinates to each imaging pattern and by identifying coordinates of an imaging pattern through which each of a plurality of input lights passes within a predetermined time interval.

For example, referring to FIG. 5A, based on the center imaging pattern, the display device 200 may sequentially assign coordinates to each of the imaging patterns associated with the nine images 501 through 909. When input light about the object to be scanned sequentially passes through the upper leftmost imaging pattern and the lower rightmost imaging pattern within a predetermined time interval, the display device 200 may sense that the object to be scanned has moved from coordinates (−1, 1) to coordinates (1, −1).

The display device 200 may verify a spatial touch by the object to be scanned by analyzing the sensing results of imaging patterns with respect to a single object to be scanned.

For example, as illustrated in FIG. 5A, when nine imaging patterns are present, the sensing result of each imaging pattern with respect to the object to be scanned may differ based on a positional relationship between the imaging pattern and the object to be scanned, an incidence angle of relevant input light, and the like. Accordingly, the display device 200 may accurately recognize an in-space position of the object to be scanned, such as a type of a spatial touch, for example, by analyzing nine items of sensing results, such as images, for example.

The display device 200 may sense an in-space position of the object to be scanned based on the fact that the sensing result of input light with respect to the object to be scanned slightly differs based on an arrangement position of each imaging pattern.

A model for calculating an in-space position of the object to be scanned using a plurality of different sensing results is disclosed in "A liquid crystal display (LCD) system with depth-sensing capability based on coded aperture Imaging," prepared by Sungjoo Suh, Changkyu Choi, Kwonju Yi, Dusik Park, and Changyeong Kim, in SID 2012 Digest of Technical Papers and thus, a further detailed description related thereto will be omitted here.

The display device 200 may sequentially sense imaging patterns with respect to the object to be scanned at predetermined time intervals, and may more accurately verify a spatial movement of a drag that occurs after a spatial touch, based on the plurality of sensing results.

For example, as illustrated in FIG. 5A, when nine imaging patterns are present, the display device 200 may deduce an in-space starting position of the object to be scanned based on the sensing results of the nine imaging patterns at a time T1, and may deduce an in-space ending position of the object to be scanned based on the sensing results of the nine imaging patterns at a time T2.

Accordingly, the display device 200 may sense that the object to be scanned has moved from coordinates (−1, −1) to coordinates (1, 1) by verifying an in-space position, for example, coordinates (−1, −1) of the object to be scanned at the time T1 and an in-space position, for example, (1, 1) of the object to be scanned at the time T2 after a predetermined period of time is elapsed from the time T1.

Accordingly, the display device 200 may accurately verify the spatial movement of the object to be scanned based on a change between the in-space starting position and the in-space ending position.

According to an embodiment, a display device may form an OLED display structure by including a pattern panel, a substrate, and a sensor panel.

The pattern panel including a plurality of display pixels may include a plurality of OLED pixels and a thin film transistor (TFT) array. For example, the pattern panel may form a plurality of imaging patterns by arranging the plurality of OLED pixels, and may arrange the plurality of OLED pixels in a form of a TFT array. Each of the plurality of OLED pixels may include one of a transparent window and an opaque window, and may allow input light from the object to be scanned to selectively pass. Each of the plurality of OLED pixels may include an IR unit to emit IR light, thereby providing an environment in which the IR light is reflected from the object to be scanned and input light may be generated in a dark state.

The substrate disposed below the pattern panel may supply power to each of the plurality of OLED pixels through the TFT array.

The sensor panel disposed below the substrate may sense N images from the input light that is received through a portion of the plurality of display pixels. Here, N denotes a natural number.

Through the above OLED display structure, the display device may perform scanning of a document and the like by employing a transparent window of a display pixel as a coding pattern.

FIGS. 6A through 6D illustrate examples of an OLED display structure according to an embodiment.

Figure 6A:
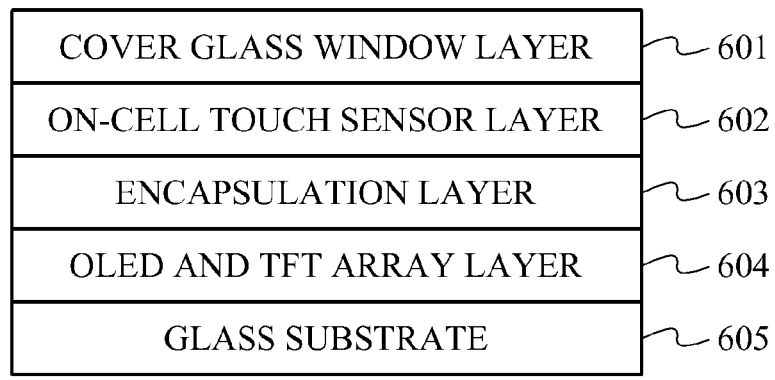
FIGS. 6A through 6D illustrate examples of an OLED display structure capable of performing scanning according to an embodiment.

An existing touch display of FIG. 6A may include a cover glass window layer 601 that is a layer for touch sensing, an on-cell touch sensor layer 602, an encapsulation layer 603, and an OLED and TFT array layer 604 that is a layer for displaying an image, and a glass substrate 605.

Figure 6B:
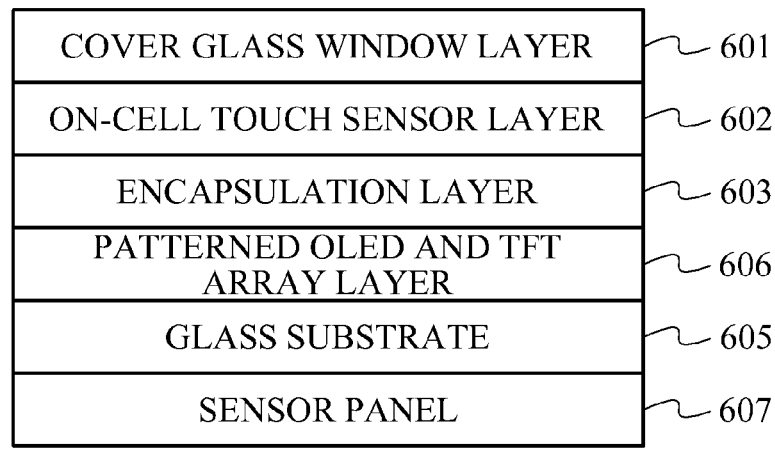

In an OLED display of FIG. 6B according to an embodiment, the OLED and TFT array layer 604 of the existing touch display structure is replaced with a patterned OLED and TFT array layer 606, and a sensor panel 607 to sense input light passing through a patterned OLED is further added to the existing touch display structure.

The patterned OLED may be a panel in which a transparent window of an OLED panel is patterned to be imaged. For example, the patterned OLED may be a panel formed by grouping a plurality of imaging patterns that is formed by arranging the first OLED pixel and the second OLED pixel of FIGS. 3A and 3B based on a predetermined rule.

Figure 6C:
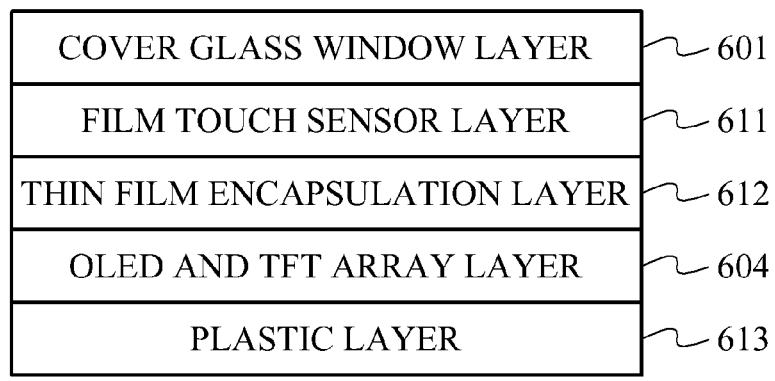
Figure 6D:
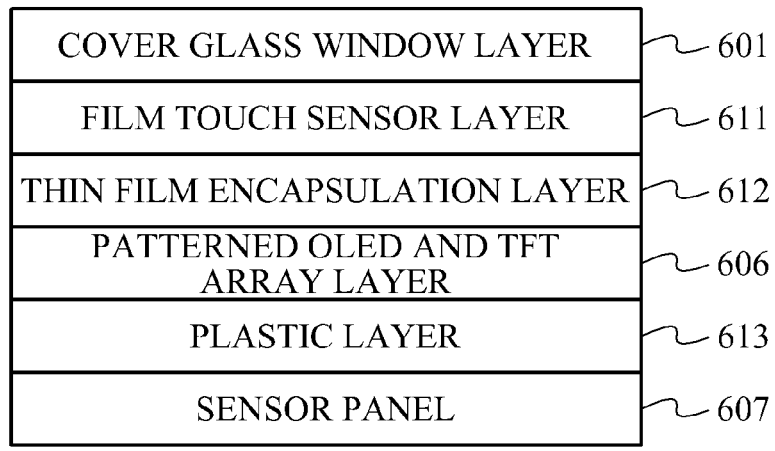
Figure 7A:
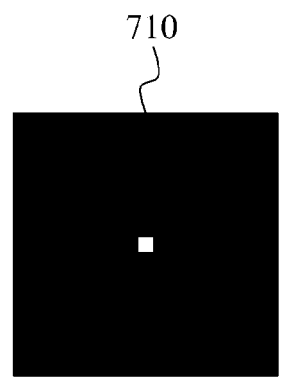
FIGS. 7A through 7D illustrate examples of an imaging pattern according to an embodiment.
Figure 7B:
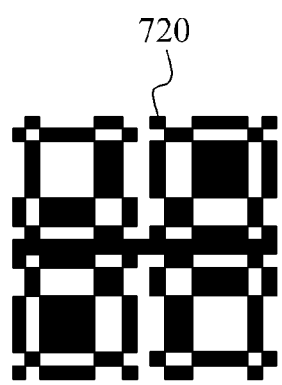
Figure 7C:
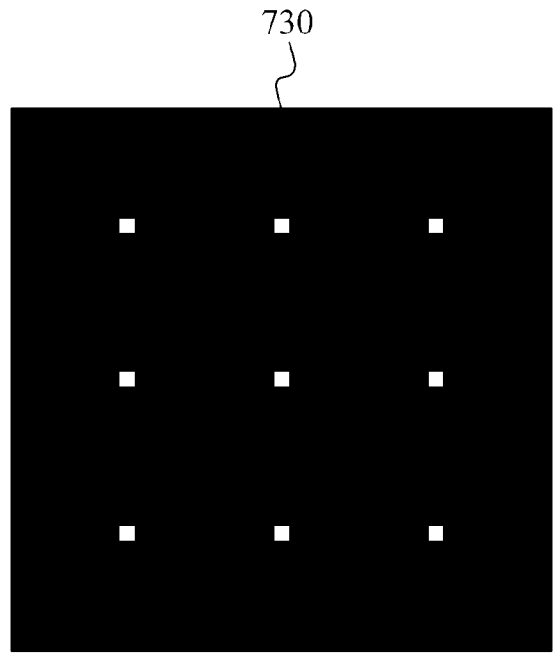
Figure 7D:
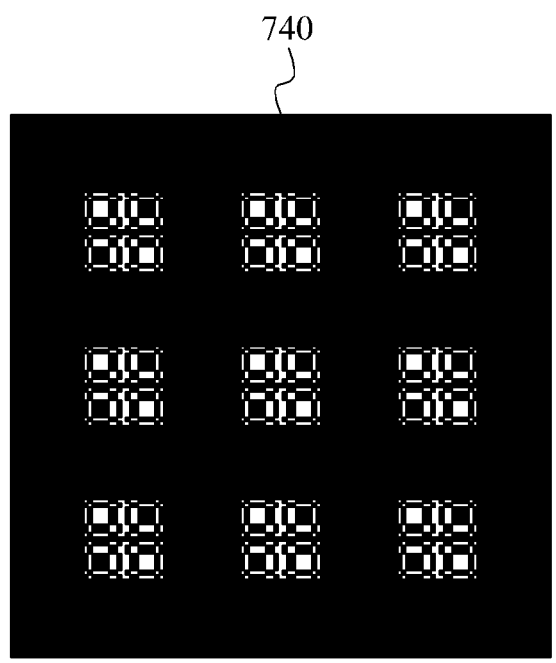

Depending on embodiments, as illustrated in FIGS. 6C and 6D, the OLED display may include a film touch sensor layer 611 as a touch sensor layer. The encapsulation layer 603 may be replaced with a thin film encapsulation layer 612, and the glass substrate 605 may be replaced with a plastic layer 613.

FIGS. 7A through 7D illustrate examples of an imaging pattern according to an embodiment.

As described above, the imaging pattern may be provided as a circular pin-hole pattern or a MURA pattern by arranging and combining a plurality of OLED pixels based on transparency of a window that is included in an OLED pixel.

The pattern panel 210 may include an imaging pattern that is formed using a plurality of OLED pixels, and may allow input light from an object to be scanned to pass through the imaging pattern.

The pattern panel 210 may form, as an imaging pattern that allows light to pass, a pin-hole pattern 710 by arranging second OLED pixels including an opaque window to be around a first OLED pixel including a transparent window.

Alternatively, the pattern panel 210 may form, as an imaging pattern, a MURA pattern 720 by alternately arranging the first OLED pixel including the transparent window and the second OLED pixel including the opaque window based on a predetermined arrangement rule.

Alternatively, the pattern panel 210 may form an imaging pattern group 730 by repeating a plurality of imaging patterns. For example, the imaging pattern group 730 may be formed by continuously stitching a plurality of pin-hole patterns 710, and may allow input light from the object to be scanned to simultaneously pass through nine imaging patterns at different viewing angles and thus, enables nine images to be sensed using the sensor panel 220.

Alternatively, the pattern panel 210 may form an imaging pattern group 740 by continuously connecting a plurality of, for example, nine MURA patterns 720. Accordingly, the sensor panel 220 may sense nine 3D images and the image creator 230 may create a full depth image of the object to be scanned by combining the nine 3D images.

Accordingly, the display device 200 may perform scanning corresponding to a plurality of number of times at a time by acquiring a plurality of images of the object to be scanned using the pattern panel 210 that is formed with a plurality of imaging patterns.

The display device 200 may perform scanning of the object to be scanned using only a scanning command after positioning the object to be scanned to be in front of a terminal. Accordingly, the user may acquire a scan image using a further simple manipulation.

The display device 200 may display a full image acquired as the scanning result on a front display and a rear display of the terminal. Accordingly, the user may quickly verify a scanning operation state.

The display device 200 may perform scanning by sensing input light from the object to be scanned that passes through an imaging pattern, with respect to a 3D image as well as a 2D image.

Hereinafter, an operation of the display device 200 according to an embodiment will be described.

A method of operating the display device 200 according to an embodiment may be performed by the display device 200.

Figure 8:
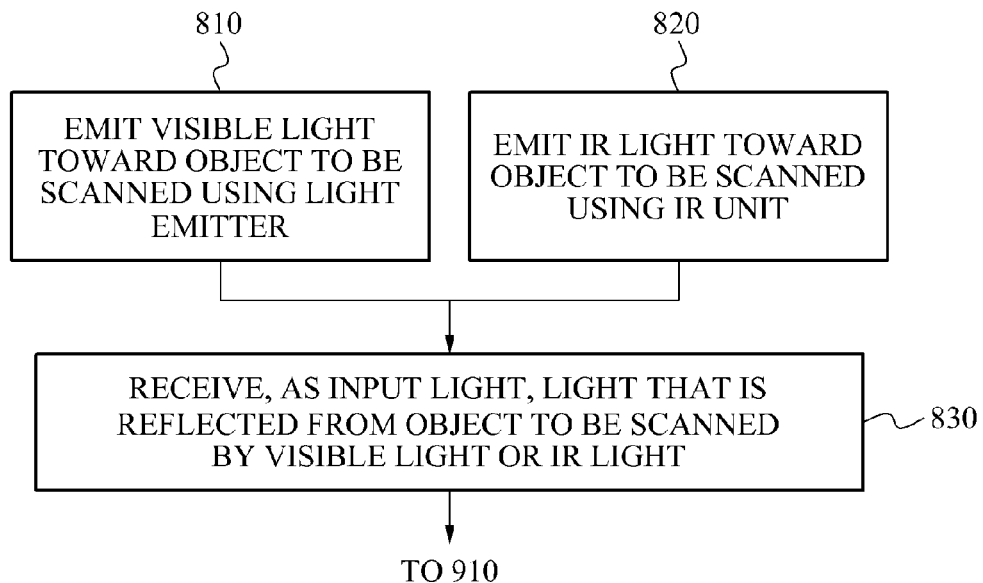
FIG. 8 illustrates a flowchart to describe a process of emitting light toward an object to be scanned for generating input light according to an embodiment.

FIG. 8 illustrates a flowchart to describe a process of emitting light toward an object to be scanned for generating input light according to an embodiment.

Referring to FIG. 8, in operation 810, the display device 200 may emit visible light toward an object to be scanned using the light emitter 250 included in an OLED pixel.

Alternatively, in operation 820, the display device 200 may emit IR light toward the object to be scanned using the IR unit 260 included in the OLED pixel. Operations 810 and 820 may be a process of emitting artificial light toward the object to be scanned using the light emitter 250 or the IR unit 260, considering a case in which the object to be scanned does not autonomously emit input light due to blockage of natural light by a terminal performing scanning.

In operation 830, the display device 200 may receive, as the input light, light that is reflected from the object to be scanned by the visible light or the IR light. Operation 830 may be a process of receiving the artificial light that is emitted toward and reflected from the object to be scanned.

Through the above operation, even in a dark state in which light is blocked, the display device 200 may smoothly perform scanning of the object to be scanned by emitting the artificial light toward the object to be scanned.

For example, when incidence of the natural light to a document corresponding to the object to be scanned is blocked by positioning the terminal including the display device 200 on the document and by performing scanning, the display device 200 may autonomously emit the artificial light toward the document and receive input light from the document.

Figure 9:
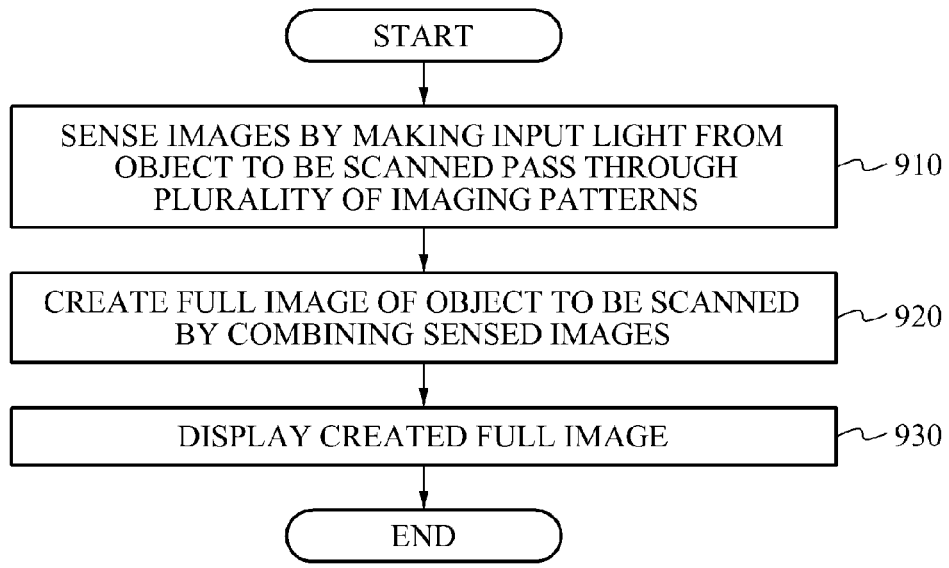
FIG. 9 illustrates a flowchart of a method of operating a display device according to an embodiment.

FIG. 9 illustrates a flowchart of a method of operating a display device according to an embodiment.

An imaging pattern may be formed in a production of a device and be mounted within the device.

For example, the imaging pattern may be formed using a plurality of OLED pixels and be included in the pattern panel 210 to allow input light from an object to be scanned to pass to a rear side, thereby providing an environment for scanning the object to be scanned.

As an example, the imaging pattern may be formed as a pin-hole pattern by arranging a first OLED pixel including a transparent window and a second OLED pixel including an opaque window based on a predetermined arrangement rule, depending on whether a window included in an OLED pixel is transparent. As another example, the imaging pattern may be formed as a MURA pattern by alternately arranging the first OLED pixel and the second OLED pixel to be in a predetermined pattern.

When the imaging pattern is physically formed, the display device 200 may sense N images by allowing input light from the object to be scanned to pass through a plurality of imaging patterns in operation 910. Here, N denotes a natural number. In operation 910, the display device 200 may acquire a plurality of images of the object to be scanned by sensing the input light that passes through the plurality of imaging patterns, and may perform scanning of the object to be scanned.

For example, the display device 200 may sense N or more images that are acquired by the input light that passes through the transparent window within the first OLED pixel.

By maintaining the plurality of imaging patterns to have a predetermined degree of transparency, the quality of image acquired by the display device 200 may be maintained.

In operation 920, the display device 200 may assign coordinates to each of the imaging patterns, and may map images that are sensed in association with the imaging patterns based on the assigned coordinates. The display device 200 may create a full image of the object to be scanned by overlapping a common portion between adjacent images.

For example, the display device 200 may create a full image of "W" (see FIG. 5) by assigning nine coordinates to 3×3 imaging patterns, respectively, by matching the nine images sensed in association with the nine imaging patterns, and by continuously overlapping a common portion between adjacent images.

In operation 930, the display device 200 may display the created full image of the object to be scanned. In operation 930, the display device 200 may display the created full image on at least a portion of a front display or may display the created full image on a rear display.

In particular, to display the full image on the rear display is to provide a user positioned behind a terminal with the full image captured through scanning even though the object to be scanned may be occluded by covering the entire object to be scanned with the front display and in this state, scanning is performed.

According to an embodiment, the display device 200 may perform scanning of an object to be scanned using only a scanning command after positioning the object to be scanned in front of a terminal. Accordingly, a user may acquire a scan image through a further simple manipulation.

According to an embodiment, the display device 200 may display a full image acquired as the scanning result on a front display and a rear display of a terminal. Accordingly, a user may quickly verify a scanning operation state.

According to an embodiment, the display device 200 may perform scanning by sensing input light from an object to be scanned that passes through an imaging pattern, with respect to a 3D image as well as a 2D image.

Depending on embodiments, the display device 200 may create a depth image of a 3D image with respect to an object to be scanned, based on sensed N images. The depth image of the 3D image may refer to an image of the object to be scanned in which a spatial depth is represented using a plurality of images For example, each image sensed in association with input light that passes through an imaging pattern may have a different spatial depth based on an angle of incidence. The display device 200 may create the full image of the object to be scanned by applying the above spatial depth.

Figure 10:
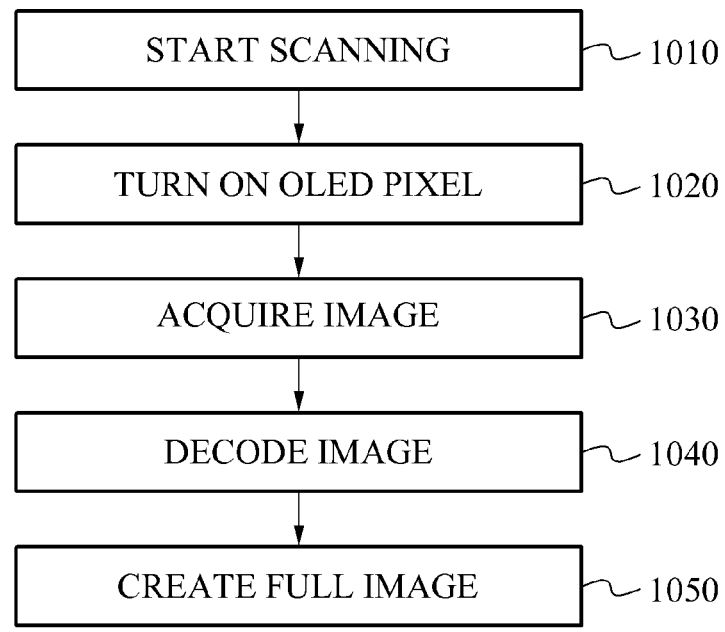
FIG. 10 illustrates a diagram to describe a substantial process of operating a display device according to an embodiment.

FIG. 10 illustrates a diagram to describe a substantial process of operating a display device.

In operation 1010, the display device 200 may start scanning after positioning an object to be scanned in front of a terminal. For example, when a user places a front display of the terminal including the display device 200 to face a document and pushes a button "scan", the display device 200 may start scanning of the document.

In operation 1020, the display device 200 may turn on an OLED pixel in response to start of scanning. For example, in interaction with pushing the button "scan", the display device 200 may receive reflected input light from the document that is the object to be scanned by applying power to the OLED pixel. Here, the display device 200 may emit artificial light, for example, visible light or IR light, toward the document using the light emitter 250 or the IR unit 260, and may receive, as input light, the artificial light that is reflected from the document in which natural light is occluded by the terminal.

In operation 1030, the display device 200 may acquire an image sensed by input light that passes through the imaging pattern. In operation 1040, the display device 200 may decode the image.

In operation 1050, the display device 200 may overlap a plurality of visualized images based on a predetermined rule, and may create the overlapping result as a full image of the object to be scanned. For example, the display device 200 may create the full image by stitching sub-images. The display device 200 may complete scanning of the object to be scanned by displaying the created full image on the front display that is positioned to face the object to be scanned or a rear display that is mounted at the rear of the terminal.

Accordingly, the display device 200 may perform scanning of the document by employing a transparent window of a transparent OLED as a coding pattern.

The display device 200 may display information associated with a scan image in real time by mounting an additional display, for example, the rear display at the rear of the terminal.

The above-described embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of embodiments, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. The computer-readable media may also be a distributed network, so that the program instructions are stored and executed in a distributed fashion. The program instructions may be executed by one or more processors. The computer-readable media may also be embodied in at least one application specific integrated circuit (ASIC) or Field Programmable Gate Array (FPGA), which executes (processes like a processor) program instructions. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

Although embodiments have been shown and described, it would be appreciated by those skilled in the art that changes may be made in these embodiments without departing from the principles and spirit of the disclosure, the scope of which is defined by the claims and their equivalents.

What is claimed is:

1. A display device, comprising:
a pattern panel comprising display pixels;
a sensor panel configured to sense N images from input light that is received in association with an object to be scanned and is received through a portion of the display pixels, N being a natural number, wherein the portion of the display pixels allows the input light to pass and another portion of the display pixels does not allow the input light to pass;
an image creator configured to create a full image of the object to be scanned based on the N images;
a display controller configured to control at least the portion of the display pixels to emit light toward the object to be scanned, wherein the emitted light is reflected from the object to be scanned, and is converted to the input light;
a front display comprising the pattern panel to display the created full image; and
a rear display positioned on the opposite side of the pattern panel to display at least a portion of the created full image,
wherein the image creator creates the full image of the object to be scanned by partially overlapping adjacent images among the N images, and wherein the pattern panel comprises organic light emitting pixels, each of which comprises an infrared (IR) unit to emit IR light.

2. The display device of claim 1, wherein the display pixels is arranged based on a predetermined arrangement rule, depending on whether the display pixels allows the input light to pass.

3. The display device of claim 2, wherein, among the display pixels, a display pixel that does not allow the input light to pass is disposed around a display pixel that allows the input light to pass.

4. The display device of claim 2, wherein the display pixels are arranged in a modified uniformly redundant array (MURA) pattern.

5. The display device of claim 4, wherein the image creator creates a depth image of the object to be scanned based on the N images.

6. The display device of claim 1, wherein the at least a portion of the display pixels comprises a transparent window.

7. The display device of claim 6, wherein a display pixel, excluding a display pixel comprising the transparent window from among the display pixels, comprises an opaque window.

8. The display device of claim 6, wherein the sensor panel senses the N images from the input light that is received through a display pixel comprising the transparent window among the display pixels.

9. The display device of claim 1, wherein the display pixels comprises an organic light emitting diode pixel.

10. The display device of claim 1, further comprising:
a light emitter to emit light toward the object to be scanned.

11. The display device of claim 1, wherein the control is configured to display the full image on at least a portion of a front display or display the full image on a rear display based on a position of the object to be scanned.

12. The display device of claim 1, wherein a number of imagining patterns is determined based on a size of a front display to receive the input light, a number objects to be scanned, and positions thereof.

13. A display device, comprising:
a pattern panel comprising display pixels;
a substrate disposed below the pattern panel;
a sensor panel disposed below the substrate configured to sense N images from input light that is received through a portion of the display pixels, N being a natural number, wherein the portion of the display pixels allows the input light to pass and another portion of the display pixels does not allow the input light to pass;

a display controller configured to control at least the portion of the display pixels to emit light toward the object to be scanned, wherein the emitted light is reflected from the object to be scanned, and is converted to the input light, an image creator to create a full image of the object by partially overlapping adjacent images among the N images;

a front display comprising the pattern panel to display the created full image; and a rear display positioned on the opposite side of the pattern panel to display at least a portion of the created full image, and wherein the pattern panel comprises organic light emitting pixels, each of which comprises an infrared (IR) unit to emit IR light.

14. The display device of claim 13, wherein the pattern panel further comprises a thin film transistor (TFT) array.

15. The display device of claim 14, wherein each of the organic light emitting diode pixels comprises one of a transparent window and an opaque window.

16. A method of operating a display device, the method comprising:

sensing N images from input light that is received in association with an object to be scanned and is received through a portion of display pixels, N being a natural number, wherein the portion of the display pixels allows the input light to pass and another portion of the display pixels does not allow the input light to pass;

creating a full image of the object to be scanned based on the N images; and displaying the created full image in a front display comprising a pattern panel, and displaying at least a portion of the created full image in a rear display positioned on the opposite side of the pattern panel, controlling at least a portion of the display pixels to emit light toward the object to be scanned using an infrared (IR) unit to emit IR light, wherein the emitted light is reflected from the object to be scanned, and is converted to the input light, wherein the creating comprises creating the full image of the object to be scanned by partially overlapping adjacent images among the N images.

17. The method of claim 16, further comprising:

displaying at least a portion of the created full image on a rear display that is positioned on an opposite side of the display pixels.

18. A non-transitory computer readable recording medium storing a program to implement the method of claim 16.

19. A method of manufacturing a display device, the method comprising:

forming a pattern panel comprising display pixels;

forming a substrate disposed below the pattern panel; and forming a sensor panel disposed below the substrate to sense N images from input light that is received through a portion of the display pixels, N being a natural number, wherein the portion of the display pixels allows the input light to pass and another portion of the display pixels does not allow the input light to pass;

controlling at least a portion of the display pixels to emit infrared (IR) light, using an IR unit, toward the object to be scanned, wherein the emitted light is reflected from the object to be scanned, and is converted to the input light, creating a full image of the object to be scanned by partially overlapping adjacent images among the N images; and displaying the created full image in a front display comprising the pattern panel, and displaying at least a portion of the created full image in a rear display positioned on the opposite side of the pattern panel.

20. The method of claim 19, wherein the pattern panel comprises organic light emitting diode pixels and a thin film transistor (TFT) array.

21. The method of claim 20, wherein each of the organic light emitting diode pixels comprises one of a transparent window and an opaque window.

22. A method for capturing an image using a display screen, the method comprising:

capturing an image on a sensor panel by receiving light that has passed through a transparent display pixel in a display panel comprising the transparent display pixel and an opaque display pixel, wherein the received light originates from the display panel, displaying the received image together with the receiving light that has passed through the transparent display pixel, and controlling at least a portion of display pixels to emit infrared (IR) light, using an IR unit, toward the object to be scanned, wherein the emitted light is reflected from the object to be scanned, and is converted to the receiving light, creating a full image of the object to be scanned by partially overlapping adjacent images among the N images; and displaying the created full image in a front display comprising a pattern panel, and displaying at least a portion of the created full image in a rear display positioned on the opposite side of the pattern panel.

23. The method of claim 22, further comprising:

displaying the received image on the display screen.

24. The method of claim 22, further comprising:

displaying the received image on an additional display screen.

* * * * *